United States Patent
Goto et al.

(10) Patent No.: US 7,679,034 B2
(45) Date of Patent: Mar. 16, 2010

(54) POWER-SUPPLYING MEMBER AND HEATING APPARATUS USING THE SAME

(75) Inventors: Yoshinobu Goto, Nagoya (JP); Hideyoshi Tsuruta, Tokai (JP)

(73) Assignee: NGK Insulators, Ltd., Nagoya (JP)

( * ) Notice: Subject to any disclaimer, the term of this patent is extended or adjusted under 35 U.S.C. 154(b) by 921 days.

(21) Appl. No.: 11/406,900

(22) Filed: Apr. 19, 2006

(65) Prior Publication Data

US 2006/0237442 A1    Oct. 26, 2006

Related U.S. Application Data (60) Provisional application No. 60/673,205, filed on Apr. 20, 2005.

(30) Foreign Application Priority Data

Apr. 14, 2006    (JP)    ............................... 2006-111541

(51) Int. Cl.
    *H05B 3/16*    (2006.01)
    *C23C 16/00*   (2006.01)
(52) U.S. Cl. .................... 219/543; 219/544; 219/444.1; 219/465.1; 219/466.1; 219/467.1; 219/546; 118/724; 118/725; 118/728
(58) Field of Classification Search ............. 219/444.1, 219/465.1, 466.1, 467.1, 543–4, 546; 118/724–5, 118/728
See application file for complete search history.

(56) References Cited

U.S. PATENT DOCUMENTS

| 5,331,134 A | 7/1994 | Kimura |
| 6,753,507 B2 * | 6/2004 | Fure et al. ................ 219/444.1 |
| 2003/0020360 A1 | 1/2003 | Luedtke |
| 2003/0173349 A1 | 9/2003 | Unno et al. |

FOREIGN PATENT DOCUMENTS

| CN | 1211312 A1 | 3/1999 |
| CN | 1389006 A1 | 1/2003 |
| EP | 0 882 939 A1 | 12/1998 |
| JP | 05-326112 A1 | 12/1993 |
| JP | 2003-086519 A1 | 3/2003 |
| KR | 2003-8235 | * 1/2003 |

* cited by examiner

*Primary Examiner*—Shawntina Fuqua
(74) *Attorney, Agent, or Firm*—Burr & Brown

(57) ABSTRACT

The power-supplying member comprises: a first rod-shaped member connected to at least one of a heating resistor and an electrode; a second rod-shaped member connected to a power supply; and a thermal-function member, which is disposed between the first rod-shaped member and the second rod-shaped member, and which has a smaller axial cross section area and a larger surface area as compared to the first and second rod-shaped members.

9 Claims, 10 Drawing Sheets

| EXAMPLE 1 | FIRST ROD-SHAPED MEMBER | SECOND ROD-SHAPED MEMBER | THERMAL-FUNCTION MEMBER |
|---|---|---|---|
| LENGTH IN LONGITUDINAL DIRECTION (mm) | 8 | 10 | 92 |
| SHAPE OF CROSS SECTION | φ5mm | φ5mm | RECTANGULAR (5×1mm) |
| CROSS SECTION AREA (mm$^2$) | 19.63 | 19.63 | 5 |
| RATIO OF AREA | | | 0.25 |
| TIP TEMPERATURE OF SECOND ROD-SHAPED MEMBER (°C) | | 180 | |
| VACUUM IN CHAMBER (Torr) | | 0.1 | |

FIG. 13B

| EXAMPLE 2 | FIRST ROD-SHAPED MEMBER | SECOND ROD-SHAPED MEMBER | THERMAL-FUNCTION MEMBER |
|---|---|---|---|
| LENGTH IN LONGITUDINAL DIRECTION (mm) | 8 | 10 | 92 |
| SHAPE OF CROSS SECTION | φ5mm | φ5mm | RECTANGULAR (5×1.5mm) |
| CROSS SECTION AREA (mm$^2$) | 19.63 | 19.63 | 7.5 |
| RATIO OF AREA | | | 0.38 |
| TIP TEMPERATURE OF SECOND ROD-SHAPED MEMBER (°C) | | 188 | |
| VACUUM IN CHAMBER (Torr) | | 0.2 | |

FIG. 14A

| COMPARATIVE EXAMPLE 1 | ROD-SHAPED MEMBER | THERMAL-FUNCTION MEMBER |
|---|---|---|
| LENGTH IN LONGITUDINAL DIRECTION (mm) | 110 | NONE |
| SHAPE OF CROSS SECTION | φ5mm | |
| CROSS SECTION AREA (mm²) | 19.63 | |
| RATIO OF AREA | | |
| TIP TEMPERATURE OF SECOND ROD-SHAPED MEMBER (°C) | 220 | |
| VACUUM IN CHAMBER (Torr) | 250 | |

FIG. 14B

| COMPARATIVE EXAMPLE 2 | FIRST ROD-SHAPED MEMBER | SECOND ROD-SHAPED MEMBER | THERMAL-FUNCTION MEMBER |
|---|---|---|---|
| LENGTH IN LONGITUDINAL DIRECTION (mm) | 8 | 10 | 92 |
| SHAPE OF CROSS SECTION | φ5mm | φ5mm | RECTANGULAR (5×2mm) |
| CROSS SECTION AREA (mm²) | 19.63 | 19.63 | 10 |
| RATIO OF AREA | | | 0.51 |
| TIP TEMPERATURE OF SECOND ROD-SHAPED MEMBER (°C) | | 210 | |
| VACUUM IN CHAMBER (Torr) | | 115 | |

FIG. 15A

| EXAMPLE 3 | FIRST ROD-SHAPED MEMBER | SECOND ROD-SHAPED MEMBER | THERMAL-FUNCTION MEMBER |
|---|---|---|---|
| LENGTH IN LONGITUDINAL DIRECTION (mm) | 8 | 10 | 92 |
| SHAPE OF CROSS SECTION | φ5mm | φ5mm | RECTANGULAR (5×1mm) |
| SURFACE AREA (mm²) | 19.63 | 19.63 | 1104 |
| VOLUME (mm³) | | | 460 |
| SURFACE AREA / VOLUME | | | 2.40 |
| TIP TEMPERATURE OF SECOND ROD-SHAPED MEMBER (°C) | | 170 | |
| VACUUM IN CHAMBER (Torr) | | 0.1 | |

FIG. 15B

| EXAMPLE 4 | FIRST ROD-SHAPED MEMBER | SECOND ROD-SHAPED MEMBER | THERMAL-FUNCTION MEMBER |
|---|---|---|---|
| LENGTH IN LONGITUDINAL DIRECTION (mm) | 8 | 10 | 92 |
| SHAPE OF CROSS SECTION | φ5mm | φ5mm | φ2mm |
| SURFACE AREA (mm²) | 19.63 | 19.63 | 577.76 |
| VOLUME (mm³) | | | 288.88 |
| SURFACE AREA / VOLUME | | | 2.00 |
| TIP TEMPERATURE OF SECOND ROD-SHAPED MEMBER (°C) | | 181 | |
| VACUUM IN CHAMBER (Torr) | | 0.8 | |

FIG. 16A

COMPARATIVE EXAMPLE 3

| | FIRST ROD-SHAPED MEMBER | SECOND ROD-SHAPED MEMBER | THERMAL-FUNCTION MEMBER |
|---|---|---|---|
| LENGTH IN LONGITUDINAL DIRECTION (mm) | 8 | 10 | 92 |
| SHAPE OF CROSS SECTION | φ5mm | φ5mm | RECTANGULAR (5×2mm) |
| SURFACE AREA (mm²) | 19.63 | 19.63 | 1288 |
| VOLUME (mm³) | | | 920 |
| SURFACE AREA/VOLUME | | | 1.40 |
| TIP TEMPERATURE OF SECOND ROD-SHAPED MEMBER (°C) | | 210 | |
| VACUUM IN CHAMBER (Torr) | | 115 | |

FIG. 16B

COMPARATIVE EXAMPLE 4

| | FIRST ROD-SHAPED MEMBER | SECOND ROD-SHAPED MEMBER | THERMAL-FUNCTION MEMBER |
|---|---|---|---|
| LENGTH IN LONGITUDINAL DIRECTION (mm) | 8 | 10 | 92 |
| SHAPE OF CROSS SECTION | φ5mm | φ5mm | φ2.5mm |
| SURFACE AREA (mm²) | 19.63 | 19.63 | 722.2 |
| VOLUME (mm³) | | | 451.375 |
| SURFACE AREA/VOLUME | | | 1.60 |
| TIP TEMPERATURE OF SECOND ROD-SHAPED MEMBER (°C) | | 206 | |
| VACUUM IN CHAMBER (Torr) | | 93 | | ns
POWER-SUPPLYING MEMBER AND HEATING APPARATUS USING THE SAME

CROSS REFERENCE TO RELATED APPLICATIONS

This application is based upon and claims the benefit of priority from provisional application 60/673,205 filed on Apr. 20, 2005, and Japanese patent application No. Tokugan 2006-111541 filed on Apr. 14, 2006; the entire contents of which are incorporated by reference herein.

BACKGROUND OF THE INVENTION

1. Field of the Invention

The present invention relates to a power-supplying member and a heating apparatus using the same, suitable for semiconductor manufacturing systems such as thermal Chemical Vapor Deposition (CVD) systems and plasma CVD systems.

2. Description of the Related Art

There is conventionally known, as disclosed in Japanese Patent Application Laid-Open No. H5-326112, heating apparatuses (hereinafter referred to as "ceramic heaters") comprise a ceramic base in which a heating resistor or an electrode are embedded; a tubular supporting member which supports the ceramic base; and a power-supplying member which is disposed to a hollowed part in the tubular supporting member, and which supplies power to the heating resistor or the electrode. According to the ceramic heaters of the related art, an end of the power-supplying member formed from a nickel or a nickel-base alloy is connected to the heating resistor or the electrode, and the other end of the power-supplying member is connected to the power supply through the connector or the like.

On the other end of power-supplying member, an o-ring made of heat-resistant fluororubber is used to hold the power-supplying member. Also, on the other end of the power-supplying member, a connector for holding the power-supplying member is made of copper or beryllium copper because the connector has to possess spring properties. Since the O-ring and the connector withstand temperatures of up to 200[° C.], the other end of the power-supplying member must be kept at or below the heat resistance temperature of the O-ring and the connector. For this reason, the other end of the power-supplying member is kept in low-temperature conditions as compared to one end of the power-supplying member on the ceramic base side, due to heat transfer of the gas around the power-supplying member, heat radiation to the supporting member, and the heat conduction to the cooling shaft fixing the other end of the power-supplying member.

However, when there is a low-pressure atmosphere close to a vacuum around the other end of the power-supplying member or there is a low gas pressure atmosphere close to a vacuum around the other end of the power-supplying member, less gas conduction occurs around the other end of the power-supplying member. Consequently, the temperature of the other end of the power-supplying member does not exhibit a significant drop, as compared to the temperature of the ceramic base side. This results in causing damage to the O-ring, thus making it impossible for the O-ring to hermetically seal and hold the hollow of the supporting member and the chamber. The problem of the temperature also leads to the problem of degrading the spring properties of the connector. This results in arcing occurring between the power-supplying member and the connector, thereby causing damage to the apparatus.

It is an object of the present invention to provide a power-supplying member that can improve durability of a heating apparatus and a heating apparatus using the same.

SUMMARY OF THE INVENTION

A power-supplying member according to the present invention is disposed to a hollowed part in a tubular supporting member, which supplies power to at least one of a heating resistor and an electrode which are embedded in a ceramic base supported by the supporting member. The power-supplying member comprises a first rod-shaped member connected to power-supplied object; a second rod-shaped member connected to power supply; and a thermal-function member. The thermal-function member has a smaller axial cross section area and a larger surface area as compared to the first and second rod-shaped members.

A heating apparatus according to the present invention comprises a ceramic base in which at least one of a heating resistor and an electrode is embedded; a tubular supporting member which supports the ceramic base; and a power-supplying member, which is disposed to a hollowed part in the tubular supporting member, and which supplies power to power-supplied object. The power-supplying member comprises a first rod-shaped member connected to the power-supplied object; a second rod-shaped member connected to a power supply; and a thermal-function member. The thermal-function member has a smaller axial cross section area and a larger surface area as compared to the first and second rod-shaped members.

According to the present invention, the thermal-function member can reduce longitudinal heat conduction and also dissipate heat to reduce heat conduction to the second rod-shaped member, even when the first rod-shaped member is connected to the power-supplied object, the power-supply causes heat application to the first rod-shaped member and then the longitudinal heat conduction from the first rod-shaped member to the second rod-shaped member. Therefore, the power-supplying member can reduce damage to an O-ring or a connector and thus improve the durability of the apparatus.

It is desirable that the ratio of axial cross section area of the thermal-function member to axial cross section area of the first and second rod-shaped member is not larger than 0.5. According to such a structure, the thermal-function member can achieve longitudinal heat choke with efficiency and a reduction in temperature of the second rod-shaped member can be achieved.

It is desirable that the thermal-function member includes a hollowed portion in axial cross section. According to such a structure, heat conduction from heating elements can be suppressed efficiently.

It is desirable that the ratio of surface area of the thermal-function member to the volume of the thermal-function member is not smaller than 2.0. According to such a structure, the thermal-function member can achieve heat choke with efficiency while further reduction in temperature of the second rod-shaped member can be achieved.

It is desirable that the thermal-function member has concavity and convexity on its axial side surface. According to such a structure, as further reduction in longitudinal heat conduction and further improvement in heat choke can be achieved, reduction in temperature of the second rod-shaped member can also be achieved.

BRIEF DESCRIPTION OF THE DRAWINGS

Exemplary embodiments of the invention will become more fully apparent from the following description and appended claims, taken in conjunction with the accompanying drawings. Understanding that these drawings depict only exemplary embodiments and are, therefore, not to be considered limiting of the invention's scope, the exemplary embodi

DETAILED DESCRIPTION OF THE INVENTION

Hereinafter, descriptions will be provided for embodiments of the present invention with reference to the drawings. While the following descriptions will be described, the same or similar reference numerals will be used to designate the same or similar components. The power-supplying member according to the present invention is a power-supplying member having the diameter D, the cross-sectional area S in the axis direction, and the length L. However, the drawings are schematic. It should be noted that ratios among dimensions of the power-supplying member shown in each of the drawings are different from real ones. Specific dimensions and the like of the power-supplying members need to be estimated with the following descriptions taken into consideration. In addition, it goes without saying that dimensional relationships and ratios are different from one drawing to another as well. The power-supplying members according to the present invention are circular in cross-sectional shape in the axis direction, unless otherwise specified. However, the power-supplying members according to the present invention may be rectangular or elliptical in cross-sectional shape in the axis direction. In such a case, the diameter of a circle having an area equal to that of a rectangle or ellipse is defined as an equivalent diameter D.

First Embodiment

Configuration of Power-Supplying Member

Figure 1:
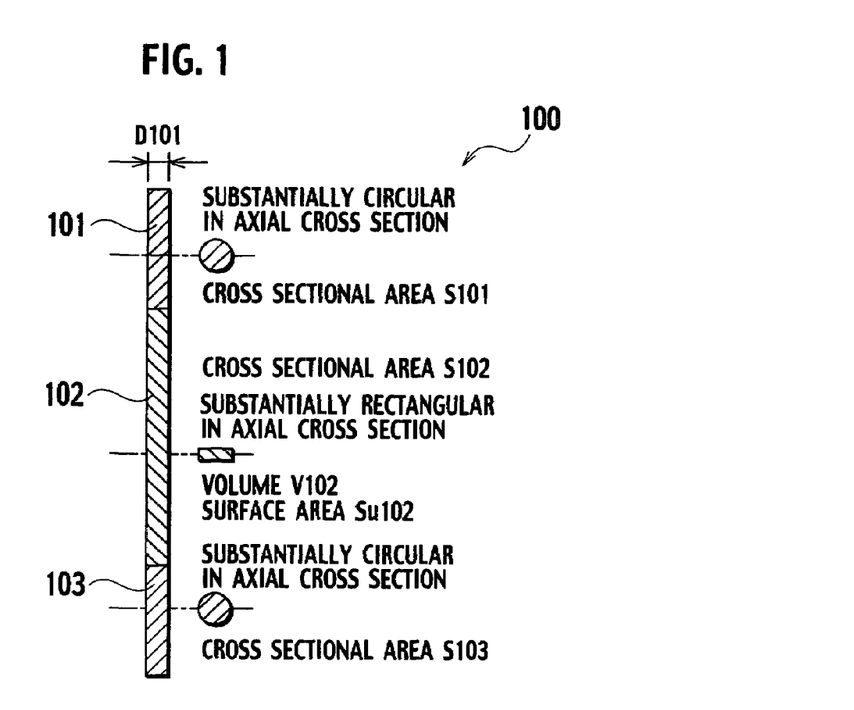
- FIG. 1 is a cross-sectional view of a power-supplying member according to first embodiment of the present invention.
Figure 2:
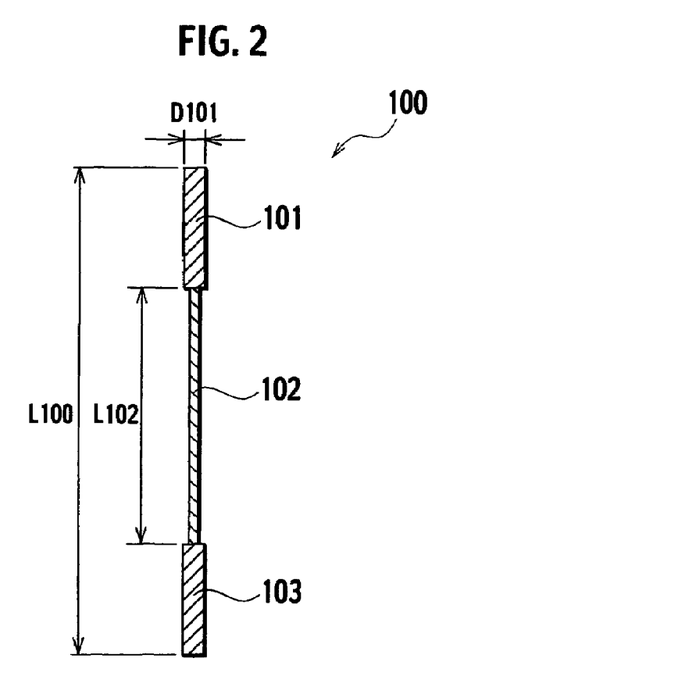
FIG. 2 is a side view of a power-supplying member shown in FIG. 1.

Descriptions will be provided for a power-supplying member according to first embodiment of the present invention with reference to FIGS. 1 and 2. FIG. 1 shows a cross-sectional view of the power-supplying member, and FIG. 2 shows a side view of the power-supplying member.

The power-supplying member 100 according to this embodiment is disposed to a hollowed part in a tubular supporting member. A heating resistor and an electrode are embedded in a ceramic base to be supported by the supporting member. The power-supplying member 100 supplies power to at least one of the heating resistor and the electrode as power-supplied object. As shown in FIGS. 1 and 2, the power-supplying member 100 includes a first rod-shaped member 101, a second rod-shaped member 103 and a thermal-function member 102. The first rod-shaped member 101 is connected to the power-supplied object. The second rod-shaped member 103 is connected to power supply. The thermal-function member 102 is disposed between the first rod-shaped member 101 and the second rod-shaped member 103. The thermal-function member 102 has a smaller axial cross section area S102 and a larger surface area Su102 as compared to the first and second rod-shaped components 101 and 103.

The power-supplying member 100 is made of a copper alloy or an aluminum alloy when a heating apparatus including the power-supplying member 100 operates at low temperatures. However, the power-supplying member 100 is made of a Ni-based heat-resistant alloy when the heating apparatus operates at temperatures in excess of 500[° C.]. With the Ni-base heat-resistant alloy, it is desirable that purity of nickel should be not lower than 99[%] in order to reduce electric resistivity.

It is desirable that the power-supplying member 100 should have higher resistance to heat, and that the power-supplying member 100 should have lower electric resistivity so that the supplying member 100 should not generate heat even though high electric current flows through the supplying member 100. In this case, the "high electric current" is not lower than 10 [A], but not higher than 50 [A] at maximum. The first and second rod-shaped components 101 and 103 are substantially circular in axial cross section in order to reduce the electric resistivity. Similarly, the thermal-function member 102 is substantially rectangular in axial cross section in order to reduce the electric resistivity.

It is desirable that the first and second rod-shaped components 101 and 103 have large cross sectional areas S101 and S103, respectively, in order to reduce the electric resistivity. Preferably, the cross sectional area S101 is not smaller than 3 [mm$^2$], in particular when the power-supplying member 100 is made of a Ni-based heat-resistant alloy containing nickel of 99[%] or higher purity.

As in the case of cross sectional area, it is desirable that the diameter D101 of the first rod-shaped member 101 and the second rod-shaped member 103 should be larger for the purpose of making their electric resistivity smaller. Preferably, the diameter D101 should be not smaller than 1 [mm] or more preferably 2 [mm], in particular when the power-supplying member 100 is made of a Ni-based heat-resistant alloy containing nickel of 99[%] or higher purity. However, it is desirable that the diameter D101 of the first rod-shaped member 101 and the second rod-shaped member 103 should be not smaller than 1 [mm], but not larger than 10 [mm]. That is because the power-supplying member 100 along with a heating-resistor power-supplying member and the like is disposed to the hollowed part in the tubular supporting member.

The ratio of the surface area Su102 of the thermal-function member 102 to the volume V102 of the thermal-function member 102 is not smaller than 1.5. Preferably, the ratio of the surface area Su102 to the volume V102 of the thermal-function member 102 is not smaller than 2.0.

The length L100 of power-supplying member 100 in the longitudinal direction is not shorter than 50 [mm]. The length L102 of thermal-function member 102 in the longitudinal direction is not shorter than 3 [mm]. However, it is desirable that such a length L102 should be not shorter than 3 [mm], but not longer than 150 [mm] in order to keep the strength of the power-supplying member 100.

Figure 3:
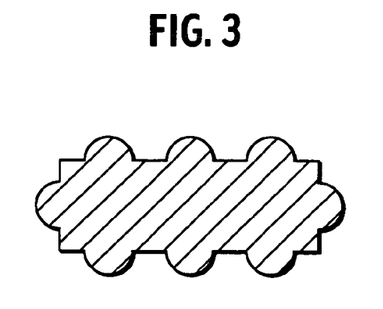
FIG. 3 is a cross-sectional view of a power-supplying member according to modification example of the first embodiment.
Figure 4:
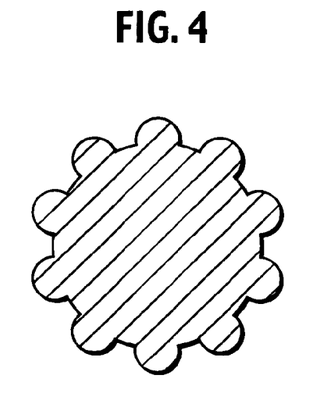
FIG. 4 is a cross-sectional view of a power-supplying member according to modification example of the first embodiment.

The thermal-function member 102 of the first embodiment is substantially rectangular in longitudinal cross section but is not limited to this configuration. As shown in FIGS. 3 and 4, the thermal-function member 102 may have convexities on its surface. According to such a structure, the thermal-function member 102 can achieve a high ratio of the surface area Su102 to the axial cross section area S102 of the heat-absorbing component 102. Thus, the power-supplying member 100 allows the thermal-function member 102 to achieve a further reduction in longitudinal heat conduction and a further improvement in heat choke. The thermal-function member 102 may have concavities as well as the convexities on its surface to achieve an approach for increasing the surface area Su102 of the heat-absorbing component 102.

Figure 5:
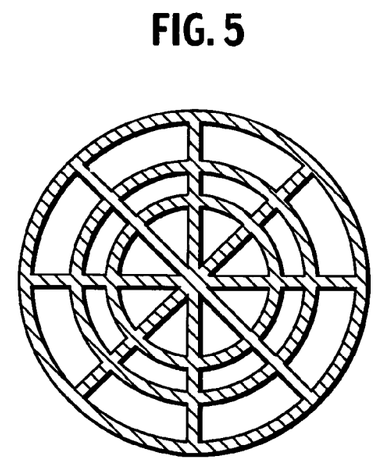
FIG. 5 is a cross-sectional view of a power-supplying member according to modification example of the first embodiment.

As shown in FIG. 5, the thermal-function member 102 may have a multiple-tube structure including circular tubes. According to such a structure, the power-supplying member 100 allows the thermal-function member 102 to achieve a high ratio of the surface area Su102 to the axial cross section area S102 of the thermal-function member 102.

Figure 6:
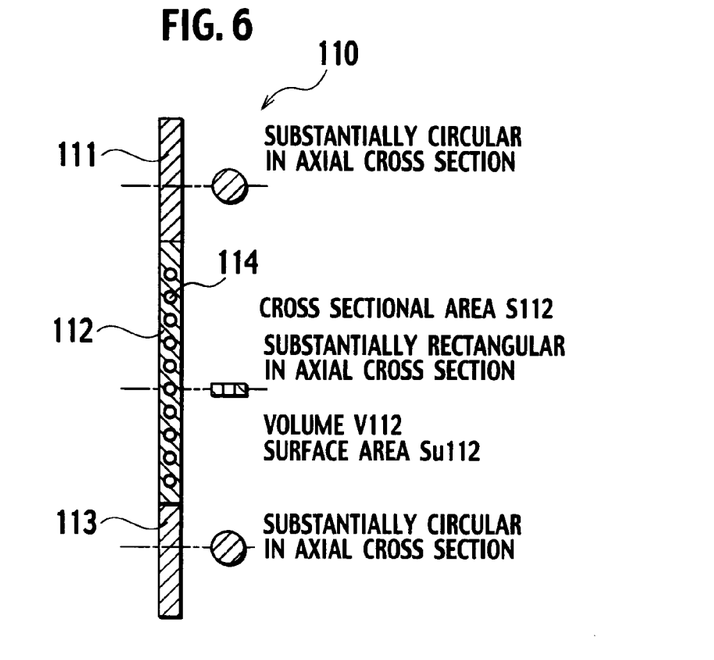
FIG. 6 is a cross-sectional view of a power-supplying member according to modification example of the first embodiment.
Figure 7:
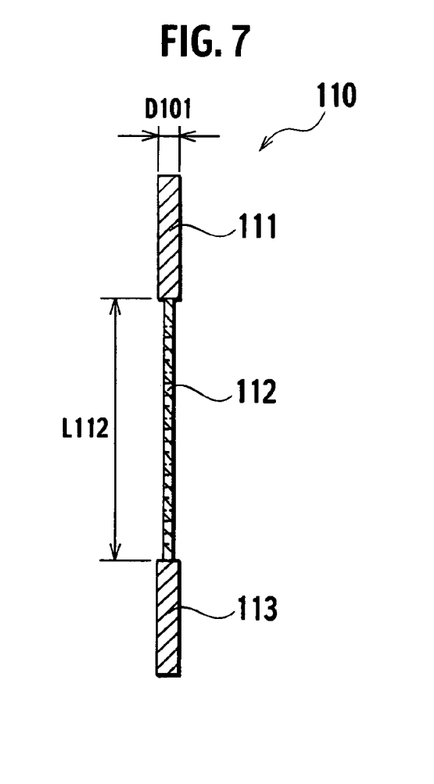
FIG. 7 is a side view of a power-supplying member shown in FIG. 6.

As shown in FIGS. 6 and 7, a thermal-function member 112 may have holes 114 penetrating through the thermal-function member 112 from one side thereof to the other side thereof. According to such a structure, a power-supplying member 110 allows the thermal-function member 112 to achieve a high ratio of a surface area Su112 to an axial cross section area S112 of the thermal-function member 112.

(Method of Manufacturing Power-Supplying Member)

Descriptions will be provided for a method of manufacturing the power-supplying member.

In manufacturing the power-supplying member, first of all, a rod-shaped member obtained by integrating the first rod-shaped member 101, the thermal-function member 102 and the second rod-shaped member 103 is produced. Next, a part of the rod-shaped member corresponding to the thermal-function member 102 is scraped or cut in substantially a rectangular shape such that the ratio of the surface area Su102 of the thermal-function member 102 to the axial cross section area S102 of the thermal-function member 102 becomes equal to or more than 1.5. Thereby, the thermal-function member 102 is formed. The power-supplying member 100 can be produced in this manner. The power-supplying member 100 can be produced by fixing the thermal-function member 102 to the first rod-shaped member 101 and the second rod-shaped member 103 by welding or soldering, after forming the thermal-function member 102.

As is clear from the above description, according to the first embodiment of the present invention, the power-supplying member 100 comprises a first rod-shaped member 101, a second rod-shaped member 103 and a thermal-function member 102. The first rod-shaped member 101 is connected to the power-supplied object. The second rod-shaped member 103 is connected to power supply. The thermal-function member 102 is disposed between the first rod-shaped member 101 and the second rod-shaped member 103. The thermal-function member 102 has a smaller axial cross section area S102 and a larger surface area Su102 as compared to the first and second rod-shaped members 101 and 103. Thereby, the thermal-function member 102 can reduce longitudinal heat conduction. In addition, as the power-supplying member 100 comprises the thermal-function member 102 having a relatively large surface area, the thermal-function member 102 can dissipate heat more efficiently.

Thus, in the power-supplying member 100, the thermal-function member 102 can reduce longitudinal heat conduction and also dissipate heat to reduce heat conduction to the second rod-shaped member 103, even when the first rod-shaped member 101 is connected to the power-supplied object, power-supply causes heat application to the first rod-shaped member 101 and then longitudinal heat conduction from the first rod-shaped member 101 to the second rod-shaped member 103. Therefore, the power-supplying member 100 can comprise the second rod-shaped member 103 having a lower temperature as compared to the first rod-shaped member 101 under high temperature conditions, thereby reducing damage to an O-ring or a connector and thus improving the durability of the apparatus.

In the power-supplying member 100, the first rod-shaped member 101 is substantially circular in axial cross section. Thus, the first rod component 101 can be easily welded, soldered, or screwed to the power-supplied object. When welding or soldering is used for bonding, the axial cross section of the first rod-shaped member 101 may be substantially a rectangular or triangular shape as well as substantially a circular shape to thus achieve the same or equivalent effect.

In the power-supplying member 100, the second rod-shaped member 103 is substantially circular in axial cross section. Thus, the second rod-shaped member 103 can be easily connected to the power supply side. In the power-supplying member 100, the second rod-shaped member 103 having the axial cross section in substantially a circular shape can reduce resistance and thus generate less heat, as compared to that in hollow or other forms.

In the power-supplying member 100, the ratio of the surface area Su102 of the thermal-function member 102 to the volume V102 of the thermal-function member 102 is equal to or more than 2.0. Thus, the thermal-function member 102 can achieve a reduction in longitudinal heat conduction and heat choke with efficiency.

In the power-supplying member 100, the thermal-function member 102 is substantially rectangular in axial section. Thus, the thermal-function member 102 can achieve a reduction in longitudinal heat conduction and heat choke with efficiency and ease.

The power-supplying member 100 has a longitudinal length L100 of 50 [mm] or more. Thus, power-supplying member 100 has a sufficient length to enable a reduction in longitudinal heat conduction and heat choke.

Second Embodiment

Configuration of Power-Supplying Member

Figure 8:
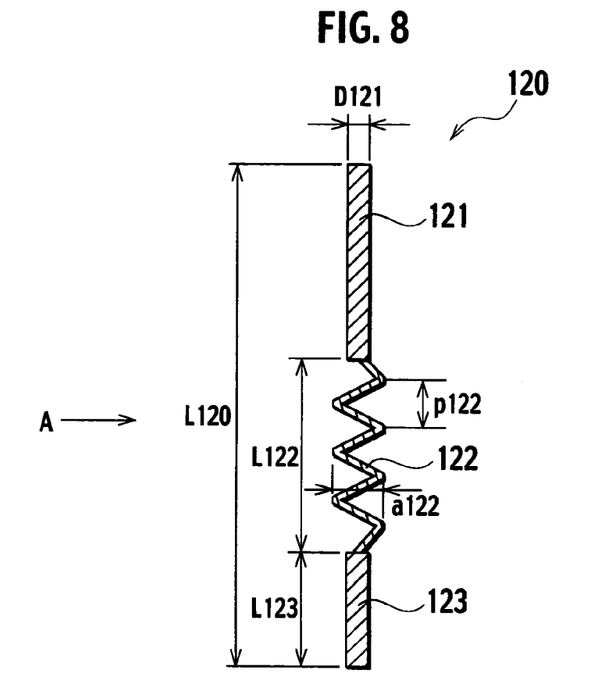
FIG. 8 is a cross-sectional view of a power-supplying member according to second embodiment of the present invention.
Figure 9:
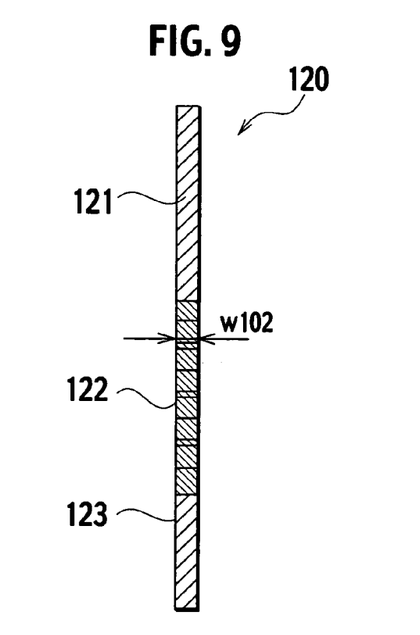
FIG. 9 is a side view of the power-supplying member in the case the power-supplying member is viewed from direction A shown in FIG. 8.

Descriptions will be provided for a power-supplying member according to second embodiment of the present invention with reference to FIGS. 8 and 9. FIG. 8 shows a side view of the power-supplying member, and FIG. 9 shows a side view of the power-supplying member in the case the power-supplying member is viewed from direction A shown in FIG. 8. The following descriptions will focus mainly on what makes the third embodiment different from the first embodiment.

In the second embodiment, the thermal-function member 122 is a member obtained by forming a thin-plate member with a structure having an alternating series of convex and concave bending portion in the longitudinal direction. Each bending portion extends along a direction orthogonal to the longitudinal direction. No specific restriction is imposed on the form of bending portion. For example, the bending portion can be formed like a triangle or a sine curve. The form of bending portion is determined by length L122, pitch p122, amplitude a122, thickness t122, and width w122.

The width w122 of the thermal-function member 102 is equal to, or not wider than, the diameter D101 of the first rod-shaped member 121 and the second rod-shaped member 123. The thickness t122 of the thermal-function member 122 is not thicker than 3 [mm]. However, in a case where the value on the width w122 and the value on the thickness t122 are too small, it is likely that the thermal-function member 122 may break before long while the thermal-expansion absorbing member 122 shrinks in the longitudinal direction repeatedly. For this reason, it is desirable that the width w122 should be not narrower than 1 [mm], but not wider than the diameter D101. In addition, it is desirable that the thickness t122 should be not thinner than 0.2 [mm], but not thicker than 2 [mm].

A higher amplitude a122 is advantageous for the purpose of reducing the amount of longitudinal deformation due to thermal expansion of a power-supplying member 120. When the power-supplying member 120 has too high an amplitude a122, the thin sheet component, however, is prone to cracking, and moreover, the power-supplying member 120 cannot be contained within the hollow of the supporting member for containing the power-supplying member 120. Thus, the amplitude a122 is limited by space. The heat-function member 122 in thin-sheet form, before being bent, has a longitudinal length 3 times a length L120 or less. Preferably, the longitudinal length of the heat-function member 122 is 2 times the length L120 or less in order to keep the strength of the power-supplying member 120.

Figure 10:
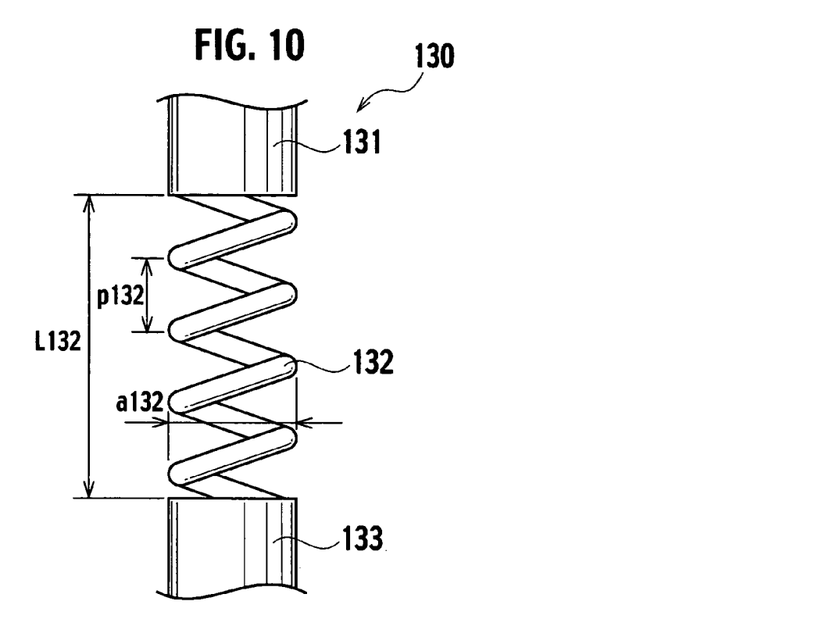
FIG. 10 is a cross-sectional view of a power-supplying member according to modification example of the second embodiment.
Figure 11:
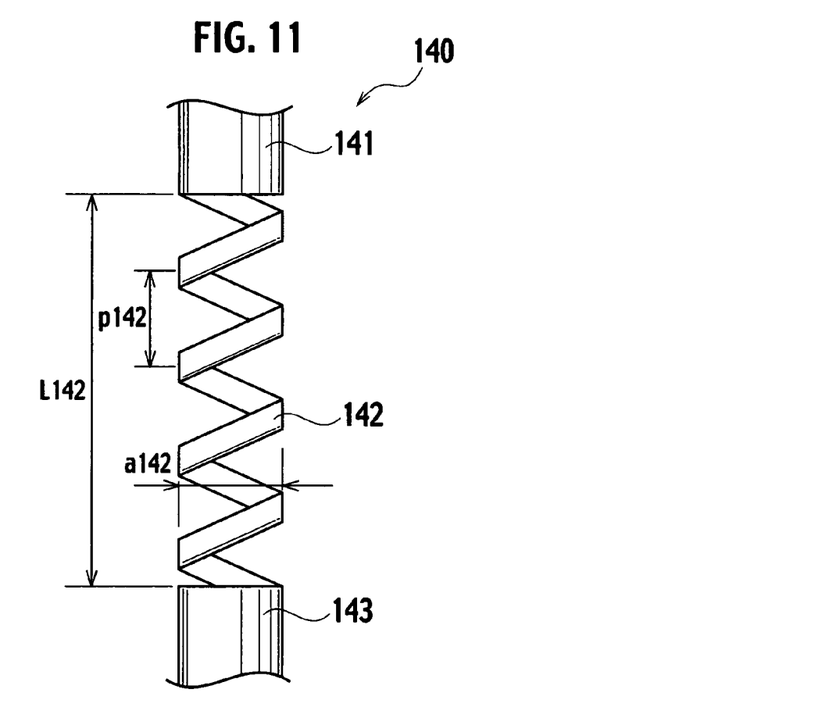
FIG. 11 is a cross-sectional view of a power-supplying member according to modification example of the second embodiment.

In the second embodiment, the heat-function 122 is made of the thin sheet component having an alternating series of convex and concave bending portions in the longitudinal direction. Each bending portion extends along a direction orthogonal to the longitudinal direction. However, the configuration of the second embodiment is not limited to this configuration. For example, as shown in FIG. 10, a power-supplying member 130 may be characterized by including a first rod-shaped member 131, a second rod-shaped member 133, and a heat-function member 132 disposed between the first and second rod-shaped members 131 and 133 and formed by coiling a rod-shaped member with a spiral structure. Alternatively, for example as shown in FIG. 11, a power-supplying member 140 may be characterized by including a first rod-shaped member 141, a second rod-shaped member 143, and a heat-function member 142 disposed between the first and second rod-shaped components 141 and 143 and formed by coiling a thin-plate member with a spiral structure.

(Method of Manufacturing Power-Supplying Member)

Descriptions will be provided for a method of manufacturing the power-supplying member.

In manufacturing the power-supplying member, first of all, a rod-shaped member obtained by integrating the first rod-shaped member 121, the thermal-function member 122 and the second rod-shaped member 123 is produced, and a part of the rod-shaped member is scraped in order that the part of the rod-shaped member can be formed into a thin-plate member. Next, the resultant thin-plate member is pressed against a mold with a structure having an alternating series of convex and concave bending portion in a longitudinal direction. Thereby, the thermal-function member 122 is formed. The power-supplying member 120 can be produced in this manner. The power-supplying member 120 can be produced by fixing the thermal-function member 122 to the first rod-shaped member 121 and the second rod-shaped member 123 by welding or soldering, after forming the thermal-function member 122 by pressing a thin-plate member against the mold.

As is clear from the above description, according to the second embodiment of the present invention, the heat-absorbing member 122 is a member formed in any one of a structure spiraling a rod-shaped member, a structure spiraling a thin-plate member, and a structure causing the thin-plate member to have alternating series of convex and concave bending portions in the longitudinal direction, each bending portion extending along a direction orthogonal to the longitudinal direction. According to such a structure, the heat-function member 122 can achieve a long distance of heat transfer from the first rod-shaped member 121 to the rod-shaped member 123 and thus achieve a further reduction in longitudinal heat conduction from the first rod-shaped member 121 to the second rod-shaped member 123, without the need for changing the longitudinal length of the heat-function member 122.

The heat-function member 122 is a member formed in any one of a structure spiraling a rod-shaped member, a structure spiraling a thin-plate member, and a structure which the thin-plate member has alternating series of convex and concave bending portions in the longitudinal direction, each bending portion extending along a direction orthogonal to the longitudinal direction. According to such a structure, the heat-function member 122 has a large surface area, thus enabling a further heat choke.

(Application Example of the Power Supply Member)

Figure 12:
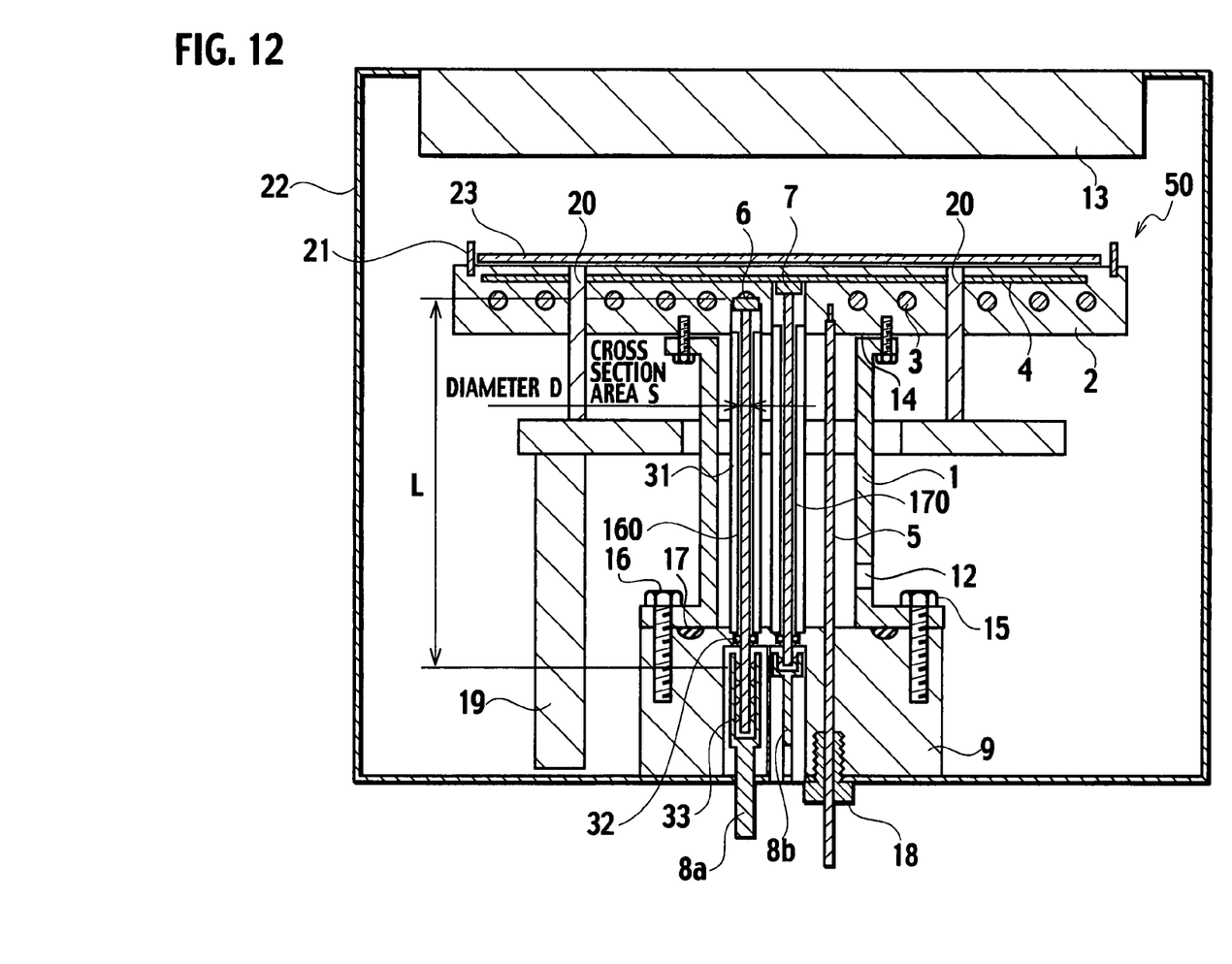
FIG. 12 is a cross-sectional view showing a heating apparatus according to an embodiment of the present invention.

The power supply member of the present invention can be applied to a heating apparatus as shown in FIG. 12 for example. The heating apparatus 50 as shown in FIG. 12 includes a supporting member 1, a ceramic base 2, a heating resistor 3, a radio-frequency electrode 4, a probe 5 for measuring temperature, a first terminal 6, a second terminal 7, connectors 8a and 8b, a cooling shaft 9, a power-supplying member 160 and a radio-frequency power-supplying member 170. The heating resistor 3 and the radio-frequency electrode 4 are embedded in the ceramic base 2. A substrate heating plate is provided with a heating plate on which a wafer 23 is placed. The ceramic base 2 includes holes in which the power-supplying member 160 and the radio-frequency power-supplying member 170 are respectively inserted. The holes extend to the first terminal 6 and the second terminal 7 from a joint surface 14 which is opposite to the substrate heating plate of the ceramic base 2. For this reason, parts respectively of the first terminal 6 and the second terminal 7 are exposed.

A plate-shaped base, such as a disc-shaped base, can be used as the material for the ceramic base 2. In addition, the ceramic base 2 can be made of ceramics, metals, composite material composed of a ceramic and a metal, or the like. For example, the ceramic base 2 is made of aluminum nitride (AlN), alumina ($Al_2O_3$), silicon nitride (SiN), silicon carbide (SiC), sialon (SiAlON), aluminum (Al), an aluminum alloy, a composite composed of an aluminum alloy and aluminum nitride, a composite composed of an aluminum alloy and SiC, and the like.

It is desirable that the ceramic base 2 should be made of aluminum nitride (AlN), alumina ($Al_2O_3$), silicon carbide (SiC) and silicon nitride (SiN). It is more desirable that the ceramic base 2 should be made of aluminum nitride (AlN) and alumina ($Al_2O_3$) which have a relative density not lower than 95%. In addition, it is the most desirable that the ceramic base 2 should be made of aluminum nitride which has a higher thermal conductivity and a relative density not lower than 95%. Accordingly, this makes it possible to provide the ceramic heater 50 exhibiting excellent heat resistance and corrosion resistance.

The heating resistor 3 and the radio-frequency electrode 4 are embedded in the ceramic base 2. Power is supplied to the heating resistor 3 from the power-supplying member 160, and thus the heating resistor 3 generates heat. The heating resistor 3 is connected to the first terminal 6. Specifically, the heating resistor 3 is connected to the first terminal 6 by caulking, soldering, or screwing. In addition, the heating resistor 3 is connected to the power-supplying member 160 through the first terminal 6, and thus receives the power supply.

Power is supplied to the radio-frequency electrode 4 from the radio-frequency power-supplying member 170, and thus the radio-frequency electrode 4 generates heat. Power with a radio frequency is supplied to the radio-frequency electrode 4 and an upper radio-frequency electrode 13 fixed to the upper wall of the chamber. Thereby, a high voltage can be applied, at high temperature, to a material gas or a cleaning gas between the radio-frequency electrode 4 and the upper radio-frequency electrode 13. Accordingly, the material gas or the cleaning gas is turned into a plasma state. The radio-frequency electrode 4 is connected to the second terminal 7. Specifically, the radio-frequency electrode 4 is connected to the second terminal 7 by caulking, soldering or screwing. The radio-frequency electrode 4 is connected to the radio-frequency power-supplying member 170 through the second terminal 7, and thus the radio-frequency electrode 4 receives the power supply.

The heating resistor 3 and the radio-frequency electrode 4 are made of a pure metal or an alloy selected from the group consisting of tantalum, molybdenum (Mo), tungsten (W), niobium (Nb), tungsten carbide (WC), platinum, rhenium, and hafnium. No restriction is imposed on the form of the heating resistor 3 and the radio-frequency electrode 4. Examples of the form include: a form which is formed by printing a print paste including powder of a refractory material; and forms of a thin film, a filament, a coiled, a mesh, and a plate which are formed by a physical deposition method and the chemical vapor deposition method.

A curled pattern and a meshed pattern or the like can be used as the pattern for the heating resistor 3 and the radio-frequency electrode 4. The power-supplying member 160 and the heating resistor 3 are connected with each other though the first terminal 6. The radio-frequency electrode 4 and the radio-frequency power-supplying member 170 are connected to each other through the second terminal 7. The first terminal 6 and the second terminal 7 are made of molybdenum, niobium or the like. Surfaces respectively of the first terminal 6 and the second terminal 7 may be coated with gold or nickel. The first terminal 6 and the second terminal 7 may be globular or columnar.

The power-supplying member 160 is disposed to the hollowed part in the tubular supporting member 1, and supplies power to the heating resistor 3 as the power supplied object. The heating resistor 3 is embedded in the ceramic base 2 supported by the supporting member 1. The radio-frequency power-supplying member 170 is disposed to the hollowed part in the tubular supporting member 1, and supplies power to the radio-frequency electrode 4 as the power supplied object. The radio-frequency electrode 4 is embedded in the ceramic base 2 that is supported by the supporting member 1.

The power-supplying member 160 and the radio-frequency power-supplying member 170 are disposed to the hollowed part in the insulating sleeve 31 in order not to contact the adjacent power-supplying member. In addition, o-ring seal 32 is disposed between the power-supplying member 160 or the radio-frequency power-supplying member 170 and the cooling shaft 9, thereby hermetically holding a chamber. Moreover, in connectors 8a and 8b, contact members 33 which have spring properties are disposed so as to contact with power-supplying member.

Each of the power-supplying member 160 and the radio-frequency power-supplying member 170 includes a first rod-shaped member connected to the power supplied object, a second rod-shaped member connected to the power supply, and a thermal-function member disposed between the first rod-shaped member and the second rod-shaped member.

The first rod-shaped member of the power-supplying member 160 is connected to the heating resistor 3 through the first terminal 6. In addition, the second rod-shaped member of the power-supplying member 160 is connected to the power supply through the connector 8a. The first rod-shaped member of the radio-frequency power-supplying member 170 is connected to the radio-frequency electrode 4 through the second terminal 7. In addition, the second rod-shaped member of the radio-frequency power-supplying member 170 is connected to the power supply through the connector 8b.

The supporting member 1 comprises a tubular hollowed part, and contains the power-supplying member 160 and the radio-frequency power-supplying member 170 in the hollowed part. The supporting member 1 is joined to the joint surface 14 which is opposite to the substrate heating plate of the ceramic base 2. The material of the supporting member 1 is any one of a ceramic and a metal which have corrosion resistance to a halogen-based corrosive gas. In addition, it is desirable that the material of the supporting member 1 should be of the same type as that of the ceramic base 2.

In a case where the material of the supporting member 1 is a metal, it is desirable that the material should be a nickel-base alloy, such as stainless steel, or an aluminum alloy. It is more desirable that the material should be inconel which is heat-resistance nickel-base alloy. The supporting member 1 is joined to the ceramic base 2 by direct joining, such as solid phase welding, or mechanical joining, such as solder joining and screw-fixing. In the case where the supporting member 1 is joined to the ceramic base 2 by mean of solid-phase welding, solid-liquid joining and solder joining, metallic parts disposed to the hollowed part in the supporting member 1 can be protected from the halogen-based corrosive gas.

Furthermore, in the case where the supporting member 1 is joined to the ceramic base 2 by mean of screw-fixing, if at least one gas-introducing hole 12 is provided to a lower part of the supporting member 1, this makes it possible to protect the metallic parts from the halogen-based corrosive gas. The halogen-based corrosive gas to be filled to the hollowed part of the supporting member 1 through such a gas-introducing hole 12 goes into the hollowed part from the lower part of the supporting member 1. For this reason, the temperature of the halogen-based corrosive gas is low enough for the gas to have less active neutral molecules. Accordingly, it makes it harder for the metallic parts to be corroded by the halogen-based corrosive gas. The gas-introducing hole 12 is not needed in the case of other joining means such as solid-phase welding, solid-liquid joining and solder joining.

Moreover, the heating apparatus can be provided with electrodes for electrostatic chucks, and the like, as electrodes. These electrodes for electrostatic chucks are used for generating electrostatic attraction by the power supply, and for thus adsorbing a substrate. No specific restriction is imposed on the intended use of the heating apparatus according to the present invention. However, examples of the intended use include chemical vapor deposition apparatuses, physical vapor deposition apparatuses, etching apparatuses, baking apparatuses, curing apparatuses for coaters. Furthermore, in a case where the power-supplying member attached to the ceramic base is held in a high-temperature environment and is fixed at its two ends, it does not matter that a modified example is a heating apparatus including the supporting member for supporting the ceramic base in addition to the power-supplying member.

EXAMPLES

Hereinafter, more detailed descriptions will be provided for the present invention giving examples with reference to FIGS. 13A-16B. The present invention is not limited to the following examples at all. In examples, a heating apparatus as shown in FIG. 12 was produced by following procedure. Specifically, first of all, a ceramic base was made in which a molybdenum coil was embedded as a heating resistor in powder composed of aluminum nitride. Then, the ceramic base was processed so as to have a thickness of 10 [mm] and a diameter φ of 320 [mm]. Next, a pin for fixing a wafer was made of alumina. Next, a supporting member was made of aluminum nitride, and the supporting member was bonded to the ceramic base by screw fixing. The supporting member was formed with a length of 100 [mm]. Next, the power-supplying member of the following experiments and the ceramic base was joined through terminals by solder-joining method using Au. Next, two power-supplying members for heating resistors, each of which was coated with an alumina tube to ensure insulation, one probe for measuring the temperature of the heating resistor, and one power-supplying member for radio-frequency electrode were contained in a hollow of the supporting member. Next, an O-ring made of fluororubber was disposed between the supporting member and a chamber of semiconductor manufacturing system to hermetically hold the hollow of the supporting member and the chamber. The O-ring made of fluororubber had a heat resistance temperature of 200[° C.]. Then, a performance test was conducted on the manufactured heating apparatus. Specifically, a nitrogen gas pressure in the chamber was set to 0.1 [Torr], the temperature of the heating apparatus was set to 400[° C.], and the temperature was increased at a rate of 10[° C.] per minute. Upon reaching a temperature of 400[° C.], the heating apparatus was then held at this temperature for 100 hours. The gas pressure in the supporting member was also 0.1 [Torr], because the ceramic base was screwed to the supporting member.

Example 1

Figure 13A:
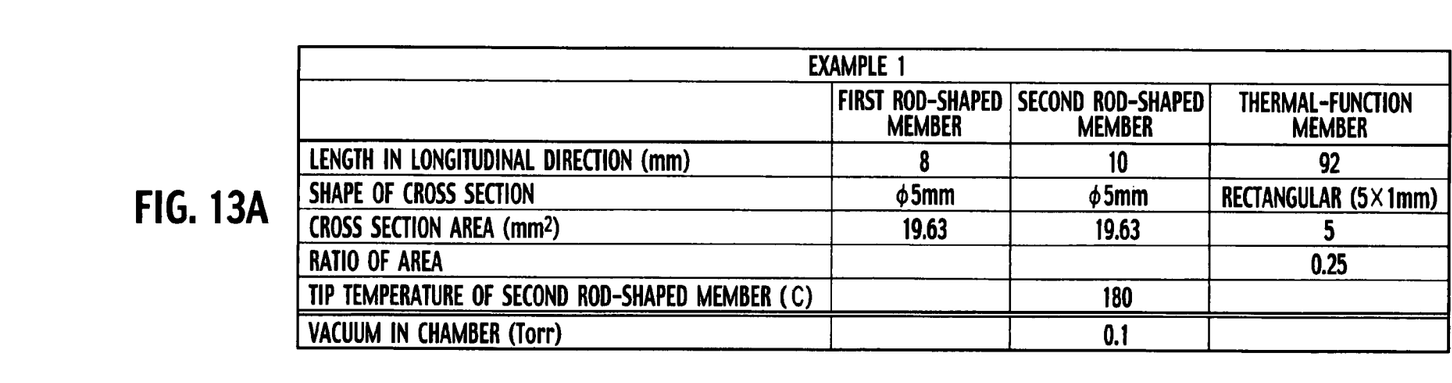
FIGS. 13A and 13B show configurations and results of high-temperature holding test according to examples 1 and 2 of power-supplying member.

In example 1, a power-supplying member that comprises a first rod-shaped member, second rod-shaped member, and a thermal-function member, and that is made of nickel with purity of 99[%], was produced. Specifically, first of all, a rod-shaped member obtained by integrating the first rod-shaped member, the thermal-function member and the second rod-shaped member was produced. The power-supplying member had a axial cross section shape of φ5 [mm]. The first rod-shaped member had a length of 8 [mm] in longitudinal direction. The second rod-shaped member had a length of 10 [mm] in longitudinal direction. The thermal-function member had a length of 92 [mm] in longitudinal direction. Next, the first and second rod-shaped members was produced by scraping a part of the rod-shaped member corresponding to the first and second rod-shaped members in order that the shape of axial cross section and cross section area became φ5 [mm] and 19.63 [mm²] respectively. Next, the thermal-function member was produced by scraping a part of the rod-shaped member corresponding to the thermal-function member in order that the shape of axial cross section and cross section area became rectangular with 5 [mm] in width and 1 [mm] in thickness and 19.63 [mm²] respectively. The power-supplying member was produced in this manner. Ratio of the cross section area of the thermal-function member to the cross section area of the first and second rod-shaped member was 0.25. Then, the high-temperature holding test was conducted on a heating apparatus including the power-supplying member. While held at a high temperature, as shown in FIG. 13A, the power-supplying member had a temperature of 180[° C.] on the tip of the second rod-shaped member. In addition, the vacuum in the chamber after high-temperature holding test maintained 0.1 [Torr]. Accordingly, the temperature in the vicinity of O-ring was not more that 200[° C.] while held at a high temperature.

Example 2

Figure 13B:
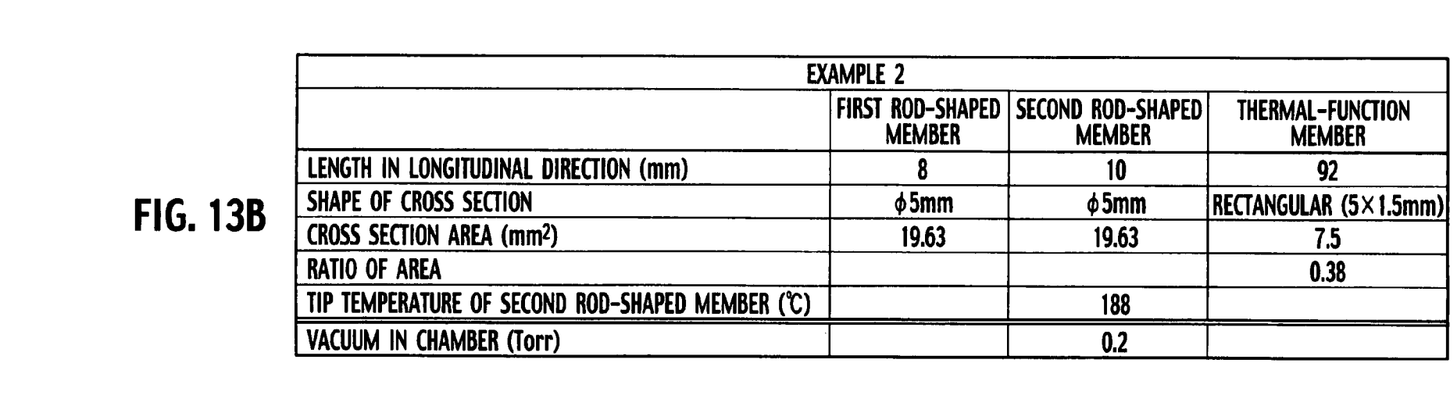

In example 2, the power-supplying member was formed by the same procedure as example 1 except for the following point. The thermal-function member was produced by scraping a part of the rod-shaped member corresponding to the thermal-function member in order that the shape of axial cross section and cross section area became rectangular with 5 [mm] in width and 1.5 [mm] in thickness and 7.5 [mm²] respectively. In other words, ratio of the cross section area of the thermal-function member to the cross section area of the first and second rod-shaped member was 0.38. Then, the high-temperature holding test was conducted on a heating apparatus including the power-supplying member. While held at a high temperature, as shown in FIG. 13B, the power-supplying member had a temperature of 188[° C.] on the tip of the second rod-shaped member. In addition, the vacuum in the chamber after high-temperature holding test maintained 0.2 [Torr]. Accordingly, the temperature in the vicinity of O-ring was not more that 200[° C.] while held at a high temperature.

Comparative Example 1

Figure 14A:
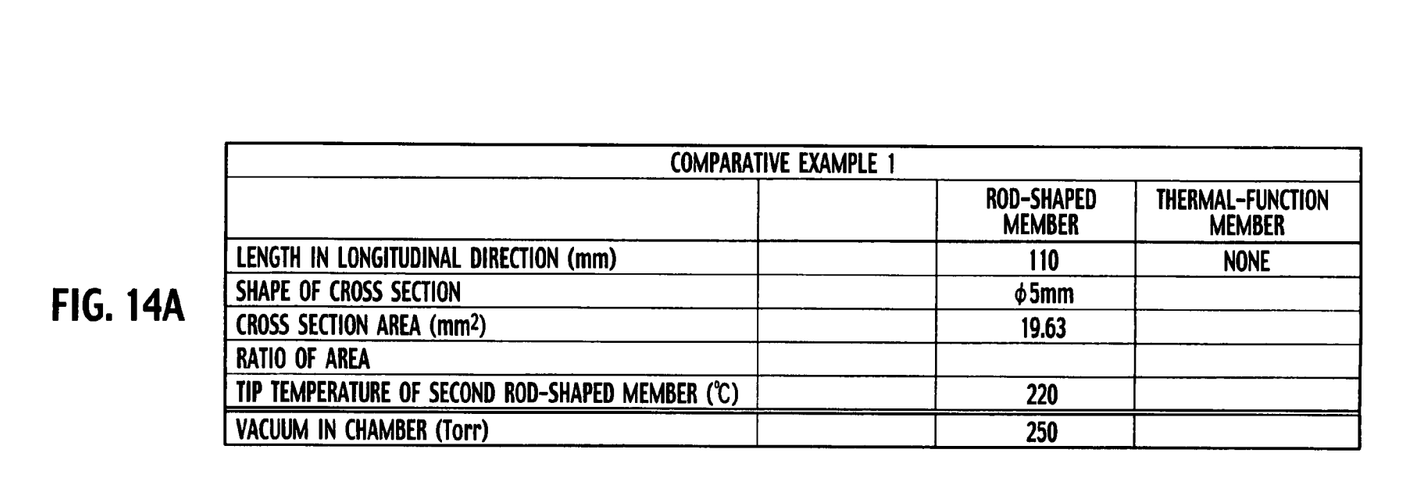
FIGS. 14A and 14B show configurations and results of high-temperature holding test according to comparative examples 1 and 2 of power-supplying member.

In comparative example 1, the power-supplying member was formed from rod-shaped member made of nickel with purity of 99[%]. The shape of axial cross section of the power-supplying member was φ5 [mm]. The axial cross section area of the power-supplying member was 19.63 [mm²]. The length of the power-supplying member in longitudinal direction was 110 [mm]. Then, the high-temperature holding test was conducted on a heating apparatus including the power-supplying member. While held at a high temperature, vacuum in the chamber degraded and was 250 [Torr] after 100 hours. In addition, while held at a high temperature, as shown in FIG. 14A, temperature of the holding part of the connector was more than 200[° C.], and the power-supplying member had a temperature of 220[° C.] on the tip of the second rod-shaped member. After the high-temperature holding test, traces of melting were observed on an inner surface of the O-ring.

Comparative Example 2

Figure 14B:
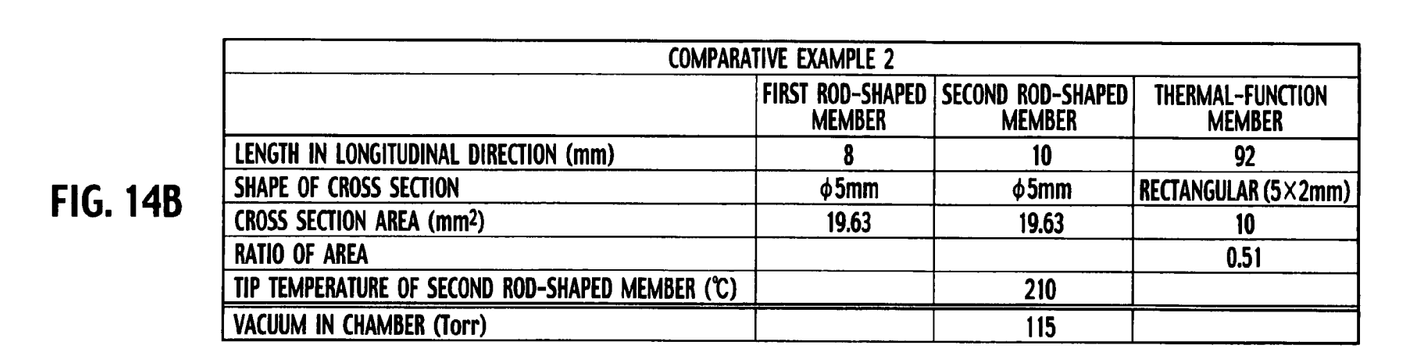

In comparative example 2, the power-supplying member was formed by the same procedure as example 1 except the following point. The thermal-function member was produced by scraping a part of the rod-shaped member corresponding to the thermal-function member in order that the shape of axial cross section and cross section area became rectangular with 5 [mm] in width and 2 [mm] in thickness and 10 [mm²] respectively. In other words, ratio of the cross section area of the thermal-function member to the cross section area of the first and second rod-shaped member was 0.51. Then, the high-temperature holding test was conducted on a heating apparatus including the power-supplying member. While held at a high temperature, as shown in FIG. 14B, the power-supplying member had a temperature of 210[° C.] on the tip of the second rod-shaped member. In addition, the vacuum in the chamber after high-temperature holding test was 115 [Torr]. Moreover, after the high-temperature holding test, traces of melting were observed on an inner surface of the O-ring.

Example 3

Figure 15A:
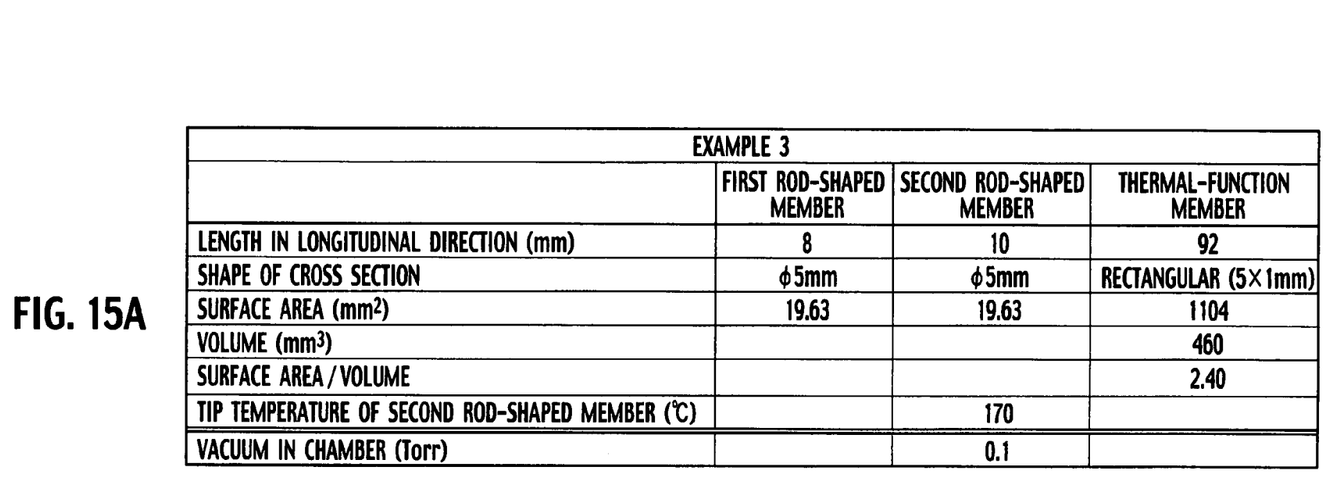
FIGS. 15A and 15B show configurations and results of high-temperature holding test according to examples 3 and 4 of power-supplying member.

In example 3, a power-supplying member that comprises a first rod-shaped member, second rod-shaped member, and a thermal-function member, and that is made of nickel with purity of 99[%], was produced. Specifically, first of all, a rod-shaped member obtained by integrating the first rod-shaped member, the thermal-function member and the second rod-shaped member was produced. The power-supplying member had a axial cross section area of φ5 [mm]. The first rod-shaped member had a length of 8 [mm] in longitudinal direction. The second rod-shaped member had a length of 10 [mm] in longitudinal direction. The thermal-function member had a length of 92 [mm] in longitudinal direction. Next, the first and second rod-shaped member was produced by scraping a part of the rod-shaped member corresponding to the first and second rod-shaped member in order that the shape of axial cross section and cross section area became φ5 [mm] and 19.63 [mm$^2$] respectively. Next, the thermal-function member was produced by scraping a part of the rod-shaped member corresponding to the thermal-function member in order that the shape of axial cross section became rectangular with 5 [mm] in width and 1 [mm] in thickness, and that surface area and volume became 1104 [mm$^2$] and 460 [mm$^3$] respectively. The power-supplying member was produced in this manner. Ratio of the surface area of the thermal-function member to the volume of the thermal-function member was 2.40. Then, the high-temperature holding test was conducted on a heating apparatus including the power-supplying member. While held at a high temperature, as shown in FIG. 15A, the power-supplying member had a temperature of 170[° C.] on the tip of the second rod-shaped member. In addition, the vacuum in the chamber after high-temperature holding test maintained 0.1 [Torr]. Accordingly, the temperature in the vicinity of O-ring was not more that 200[° C.] while held at a high temperature.

Example 4

Figure 15B:
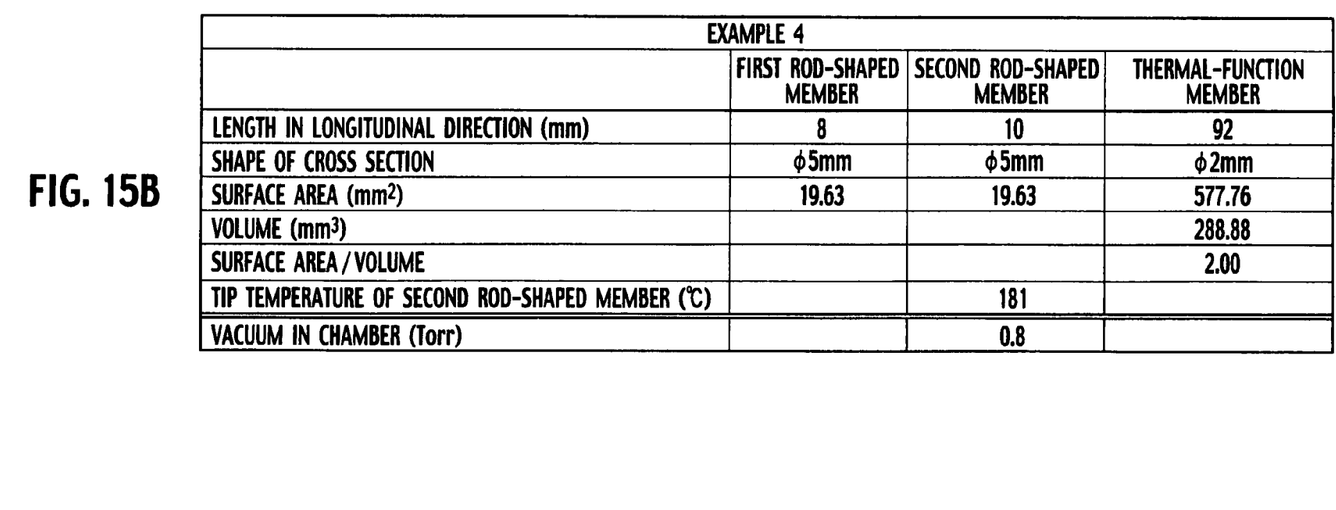

In example 4, the power-supplying member was formed by the same procedure as example 3 except the following point. The thermal-function member was produced by scraping a part of the rod-shaped member corresponding to the thermal-function member in order that the shape of axial cross section became φ2 [mm], and that surface area and volume became 577.76 [mm$^2$] and 2888.88 [mm$^3$] respectively. The power-supplying member was produced in this manner. Ratio of the surface area of the thermal-function member to the volume of the thermal-function member was 1.60. Then, the high-temperature holding test was conducted on a heating apparatus including the power-supplying member. While held at a high temperature, as shown in FIG. 15B, the power-supplying member had a temperature of 181[° C.] on the tip of the second rod-shaped member. In addition, the vacuum in the chamber after high-temperature holding test was 0.8 [Torr]. Accordingly, the temperature in the vicinity of O-ring was not more that 200[° C.] while held at a high temperature.

Comparative Example 3

Figure 16A:
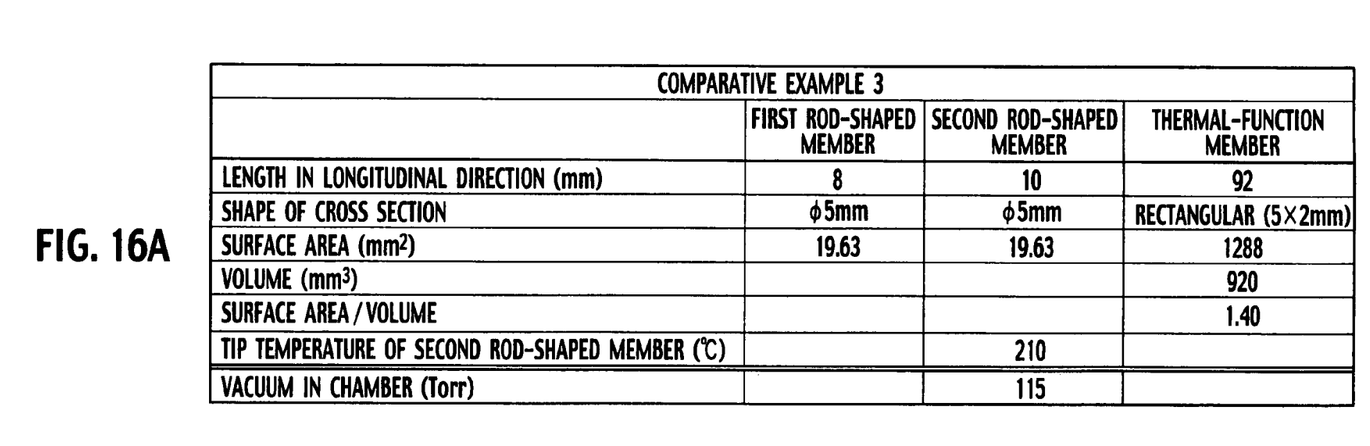
FIGS. 16A and 16B show configurations and results of high-temperature holding test according to comparative examples 3 and 4 of power-supplying member.

In comparative example 3, the power-supplying member was formed by the same procedure as example 3 except the following point. The thermal-function member was produced by scraping a part of the rod-shaped member corresponding to the thermal-function member in order that the shape of axial cross section became rectangular with 5 [mm] in width and 2 [mm] in thickness, and that surface area and volume became 1288 [mm$^2$] and 920 [mm$^3$] respectively. The power-supplying member was produced in this manner. Ratio of the surface area of the thermal-function member to the volume of the thermal-function member was 1.40. Then, the high-temperature holding test was conducted on a heating apparatus including the power-supplying member. While held at a high temperature, as shown in FIG. 16A, the power-supplying member had a temperature of 210[° C.] on the tip of the second rod-shaped member. In addition, the vacuum in the chamber after high-temperature holding test was 115 [Torr]. Moreover, after the high-temperature holding test, traces of melting were observed on an inner surface of the O-ring.

Comparative Example 4

Figure 16B:
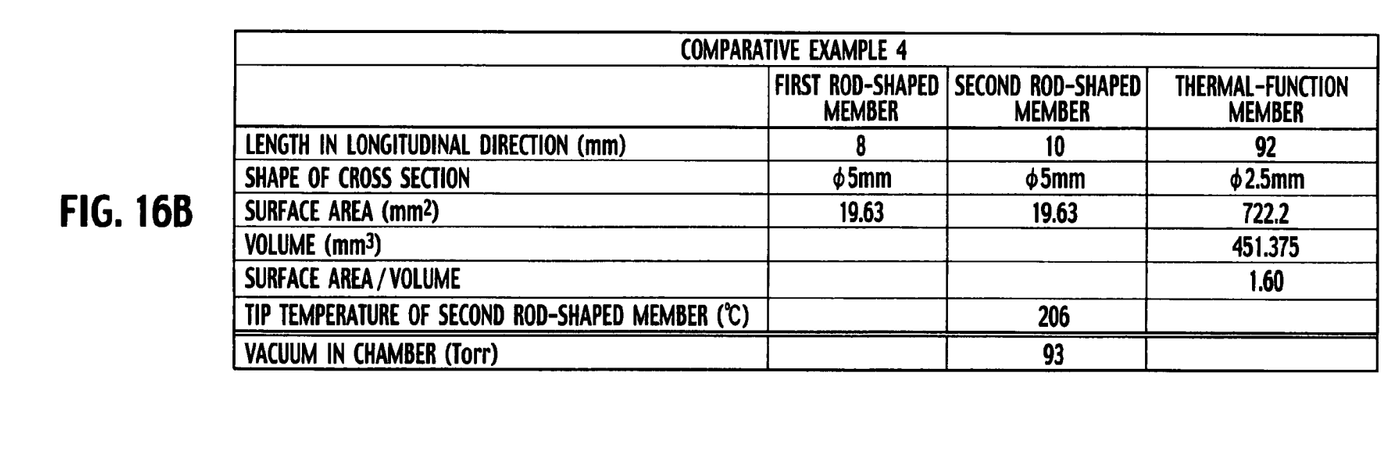

In comparative example 4, the power-supplying member was formed by the same procedure as example 3 except the following point. The thermal-function member was produced by scraping a part of the rod-shaped member corresponding to the thermal-function member in order that the shape of axial cross section became φ2.5 [mm], and that surface area and volume became 722.2 [mm$^2$] and 451.375 [mm$^3$] respectively. The power-supplying member was produced in this manner. Ratio of the surface area of the thermal-function member to the volume of the thermal-function member was 1.60. Then, the high-temperature holding test was conducted on a heating apparatus including the power-supplying member. While held at a high temperature, as shown in FIG. 16B, the power-supplying member had a temperature of 206[° C.] on the tip of the second rod-shaped member. In addition, the vacuum in the chamber after high-temperature holding test was 93 [Torr]. Moreover, after the high-temperature holding test, traces of melting were observed on an inner surface of the O-ring.

Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:

1. A power-supplying member, which is disposed in a hollow part of a tubular supporting member, and which supplies power to at least one of a heating resistor and an electrode which are embedded in a ceramic base supported by the tubular supporting member, the power-supplying member comprising:
   a first rod-shaped member connected to said at least one of a heating resistor and an electrode;
   a second rod-shaped member connected to a power supply; and
   a thermal-function member, which is disposed between the first rod-shaped member and the second rod-shaped member, and which has a smaller axial cross section area and a larger surface area as compared to the first and second rod-shaped members,
   wherein a ratio of the axial cross sectional area of the thermal-function member to the axial cross sectional areas of the first and second rod-shaped members is not larger than 0.5.

2. The power-supplying member according to claim 1, wherein the thermal-function member includes a hollowed portion in axial cross section.

3. The power-supplying member according to claim 1, wherein the ratio of surface area of the thermal-function member to volume of the thermal-function member is not smaller than 2.0.

4. The power-supplying member according to claim 2, wherein the ratio of surface area of the thermal-function member to volume of the thermal-function member is not smaller than 2.0.

5. The power-supplying member according to claim 1, wherein the thermal-function member has concavity and convexity on its axial side surface.

6. The power-supplying member according to claim 2, wherein the thermal-function member has concavity and convexity on its axial side surface.

7. The power-supplying member according to claim 3, wherein the thermal-function member has concavity and convexity on its axial side surface.

8. The power-supplying member according to claim 4, wherein the thermal-function member has concavity and convexity on its axial side surface.

9. A heating apparatus comprising:

a ceramic base in which at least one of a heating resistor and an electrode are embedded;

a tubular supporting member which supports the ceramic base; and a power-supplying member, which is disposed in a hollow part of the tubular supporting member, and which supplies power to at least one of the heating resistor and the electrode, wherein the power-supplying member comprises a first rod-shaped member connected to said at least one of a heating resistor and an electrode a second rod-shaped member connected to a power supply, and a thermal-function member, which is disposed between the first rod-shaped member and the second rod-shaped member, and which has a smaller axial cross section area and a larger surface area as compared to the first and second rod-shaped members, wherein a ratio of the axial cross sectional area of the thermal-function member to the axial cross sectional areas of the first and second rod-shaped members is not larger than 0.5.

* * * * *